(12) United States Patent
Soda et al.

(10) Patent No.: US 8,586,478 B2
(45) Date of Patent: Nov. 19, 2013

(54) METHOD OF MAKING A SEMICONDUCTOR DEVICE

(75) Inventors: Eiichi Soda, Kawasaki (JP); Yunpeng Yin, Armonk, NY (US); Sivananda Kanakasabapathy, Armonk, NY (US)

(73) Assignees: Renesas Electronics Corporation, Kanagawa (JP); IBM Corporation, Armonk, NY (US)

( * ) Notice: Subject to any disclaimer, the term of this patent is extended or adjusted under 35 U.S.C. 154(b) by 0 days.

(21) Appl. No.: 13/424,932

(22) Filed: Mar. 20, 2012

(65) Prior Publication Data

US 2012/0329268 A1 Dec. 27, 2012

Related U.S. Application Data

(60) Provisional application No. 61/468,365, filed on Mar. 28, 2011.

(51) Int. Cl.
*H01L 21/44* (2006.01)

(52) U.S. Cl.
USPC ............................. 438/671; 257/E21.582

(58) Field of Classification Search
USPC ................. 438/671; 257/E21.582, E21.595
See application file for complete search history.

(56) References Cited

U.S. PATENT DOCUMENTS

| | | | | |
|---|---|---|---|---|
| 6,083,824 A * | 7/2000 | Tsai et al. | | 438/629 |
| 7,241,651 B2 * | 7/2007 | Miwa | | 438/195 |
| 7,732,341 B2 * | 6/2010 | Koh et al. | | 438/717 |

* cited by examiner

*Primary Examiner* — William D Coleman
(74) *Attorney, Agent, or Firm* — Young & Thompson

(57) ABSTRACT

An improved method of making interconnect structures with self-aligned vias in semiconductor devices utilizes sidewall image transfer to define the trench pattern. The sidewall height acts as a sacrificial mask during etching of the via and subsequent etching of the trench, so that the underlying metal hard mask is protected. Thinner hard masks and/or a wider range of etch chemistries may thereby be utilized.

13 Claims, 10 Drawing Sheets

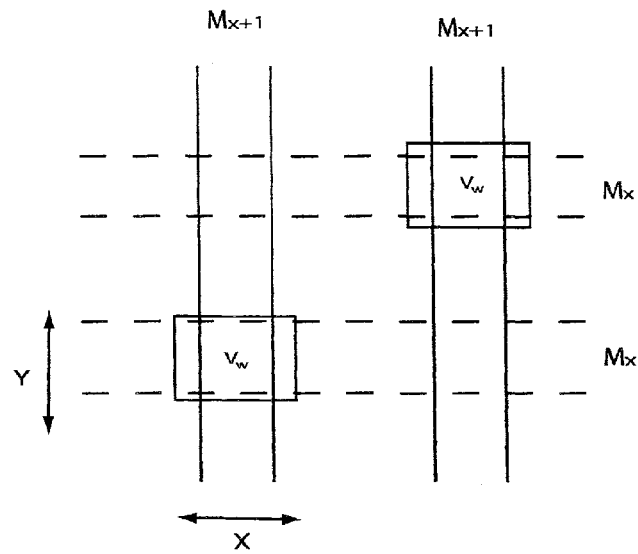
Fig. 25
PRIOR ART
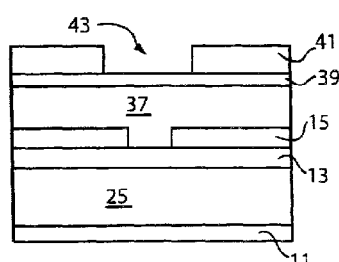 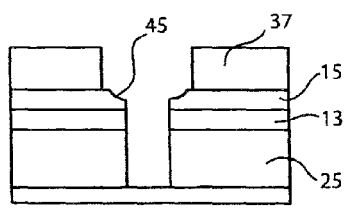 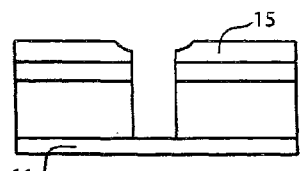
Fig. 26a      Fig. 27a      Fig. 28a
PRIOR ART    PRIOR ART    PRIOR ART
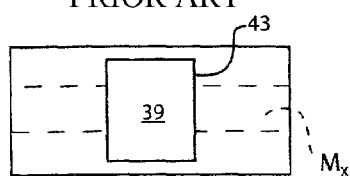 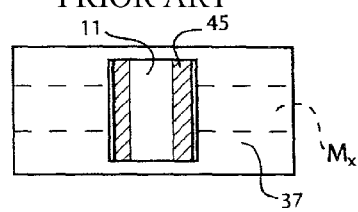 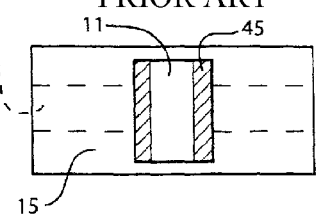
Fig. 26b      Fig. 27b      Fig. 28b
PRIOR ART    PRIOR ART    PRIOR ART

METHOD OF MAKING A SEMICONDUCTOR DEVICE

BACKGROUND OF THE INVENTION

1. Field of the Invention

The invention relates to methods of making integrated circuits. More specifically it relates to methods of fabricating interconnect structures in semiconductor devices.

2. Description of Related Art

The need for lower resistance and capacitance in interconnect dielectric films caused by the ever-increasing miniaturization of semiconductor devices has led to the use of copper to form interconnects and vias rather than aluminum. When those structures are formed from copper a dual damascene process is typically used, in view of the difficulty in dry etching copper.

Dual damascene processes are loosely classified into trench first and via first types, each of which includes a variety of subtypes. For example, U.S. Pat. No. 6,083,824 discloses patterning a hard mask to define a trench pattern to be formed in an underlying interlayer dielectric, and then forming a photoresist layer bearing a via hole pattern overlapping the hard mask, to improve alignment of the trenches and vias. The vias are etched through the photoresist and the hard mask, and following removal of the photoresist the trenches are formed through the hard mask.

However, as chip sizes and circuit layouts continue to shrink, the aspect ratio of the layers utilized to form the interconnect structures increases, and in particular increasingly thick hard masks are needed. Moreover, in trench first techniques where the hard mask bearing the trench pattern is used also to align the vias, the mask is often exposed to two etching steps. Such processes are therefore limited in that, even with increased hard mask thickness and selection of dielectric etch chemistries for via formation that are selective against the metal hard mask, the hard mask layer is increasingly eroded. Moreover, the need for thicker mask layers unnecessarily increases the aspect ratio of overlying layers, which can lead to pattern collapse of the intermediate structures.

SUMMARY OF THE INVENTION

The present inventors have discovered that improved interconnect structures can be formed in semiconductor devices by a method in which sidewall image transfer is utilized to define a trench pattern, with the residual sidewalls then being used as sacrificial masks during subsequent formation of vias. The relatively tall residual sidewalls, especially when formed of an insulating material, permit using significantly thinner underlying metal hard mask layers than in the conventional techniques referred to above.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 13b is a plan view of the device as shown in FIG. 13a;

FIG. 24b is a plan view of the device as shown in FIG. 24a;

FIG. 25 is a plan view illustrating the concepts involved in forming self-aligned vias in trench first metal hard mask integration;

FIG. 26(a) illustrates a step of forming self aligned vias utilizing a metal hard mask according to a conventional process;

FIG. 26(b) a plan view of the device of FIG. 26(a); and

FIG. 27(a) a cross-sectional view through the device of FIG. 26(a) at a subsequent stage of processing;

FIG. 27(b) a plan view of the device of FIG. 27(a);

FIG. 28(a) a cross-sectional view through the device of FIG. 26(a) at a subsequent stage of processing; and FIG. 28(b) a plan view of the device of FIG. 28(a).

DETAILED DESCRIPTION OF PREFERRED EMBODIMENTS

Figure 1:
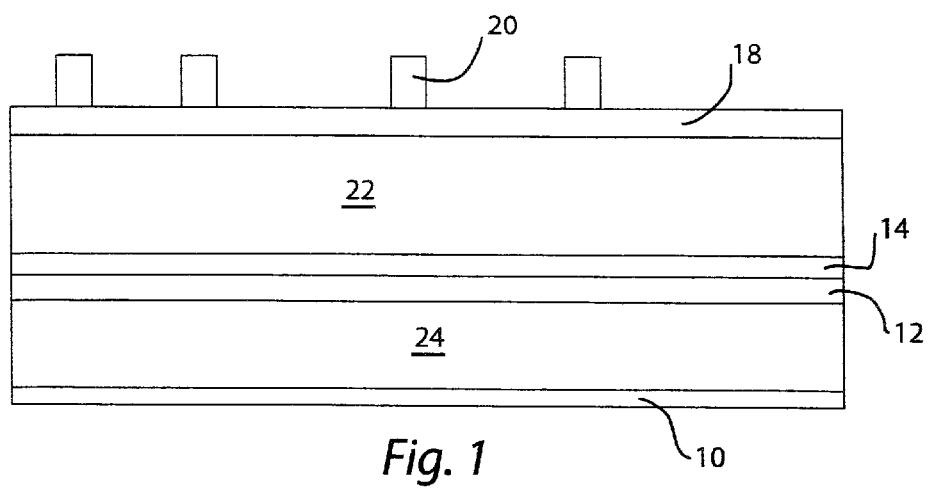
FIG. 1 is a cross-sectional view through a semiconductor device at a first stage of processing according to a preferred embodiment of the method according to the present invention.

Conventional techniques for forming a self-aligned via (SAV) include those termed "trench first," in which a trench pattern is formed in a metal hard mask. With reference to FIG. 25, the via $V_w$ is self-aligned in the direction X parallel to the $M_x$ trenches, but is not self aligned in the direction Y parallel to the $M_{x+1}$ trenches. In particular, the metal hard mask bearing the previously-formed trench pattern for the $M_{x+1}$ trenches is intended to confine the via $V_w$ in the X direction.

With reference to the sectional view of FIG. 26a and its corresponding plan view FIG. 26b, reference numeral 11 denotes a dielectric cap layer that separates the depicted interconnect layer from an underlying interconnect layer (or from a semiconductor substrate when the depicted layer is the first interconnect layer), not shown, whereas reference numeral 25 is an interlayer dielectric film, with element 13 being a further dielectric cap layer on which a metal hard mask layer 15 is formed. Layer 15 includes an opening corresponding to a previously-formed trench pattern, whereas via lithography including organic planarizing layer (OPL) 37, anti-reflective coating 39 and photoresist layer 41 having a via pattern 39, is built up on the hard mask layer 15.

After the structure shown in FIGS. 26a and 26b is etched, the structure depicted schematically in FIGS. 27a and 27b results. In this conventional process type, it is necessary to choose an etching chemistry that is highly selective against the material of metal hard mask 15; nevertheless, the SAV dielectric etch significantly erodes the metal hard mask 15 in the area designated 45, which necessitates use of a relatively thick hard mask 15.

Following the OPL strip, the structure depicted in FIGS. 28a and 28b is obtained, which continues to display significant erosion 45 of layer 15. Moreover, as the hard mask typically remains in the finished device, the area of the topmost portion of the via is not precisely defined.

The embodiments of the invention described below seek to improve upon the techniques described in connection with FIGS. 25-28.

In FIG. 1 a semiconductor device is illustrated in cross-section. All of the illustrated elements are in section. Layer 10 is a dielectric cap, such as nitrogen-doped silicon carbide or Si—N—C—H (NBLOk), that separates the illustrated structure from an underlying substrate or lower interlayer film (not shown). Layer 24 is an interlayer dielectric material, preferably a low-k dielectric material, and even more preferably an ultra-low-k dielectric material. Low-k dielectric materials are characterized by dielectric constants less than that of silicon oxide (3.9), whereas ultra-low-k dielectric materials typically have a dielectric constant less than 2.5. Layer 24 is preferably formed at a thickness of about 100 nm, although that thickness can be greater or lesser.

Above layer 24 is a further dielectric cap layer 12, which in this embodiment is preferably silicon oxide formed at a thickness of about 15 nm. More particularly, layer 12 is preferably a hard mask of $SiO_2$ deposited at low density, such as tetraethylorthosilicate (TEOS). Above layer 12 is a metal hard mask layer 14, which in this embodiment is TiN formed to a thickness of preferably about 25 nm. Overlying layer 14 is an amorphous carbon layer 22 to help control reflectivity during photolithography in conjunction with the dielectric cap layers and other anti-reflective coatings described herein. Amorphous carbon layer 22 will also be patterned to form the mandrels used as a template for sidewall formation, as described below. Amorphous carbon layer 22 is preferably formed to a thickness of about 140 nm, although as discussed below the thickness of the amorphous carbon layer 22 can vary widely over a range from about 80 to about 200 nm, and preferably from about 120 to about 200 nm.

Next, a silicon-containing organic anti-reflective coating (SiARC) 18 is present on the amorphous carbon layer 22.

Lastly, layer 20 is a photoresist pattern used for the mandrel lithography that will now be described.

Figure 2:
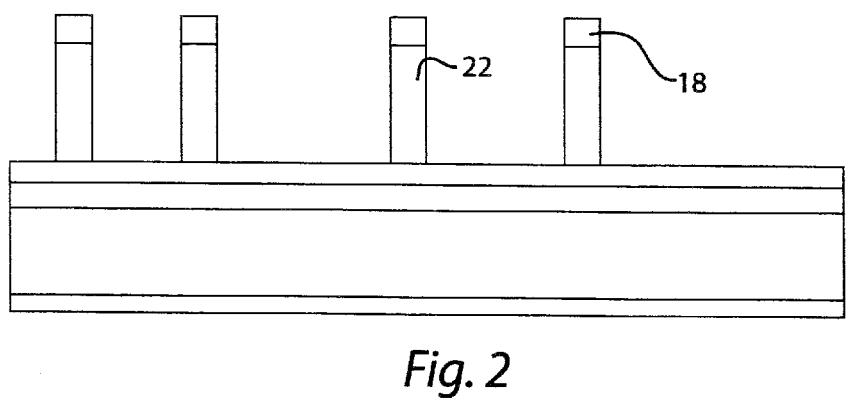
FIG. 2 a cross-sectional view through the semiconductor device of FIG. 1 at a subsequent stage of processing.
Figure 3:
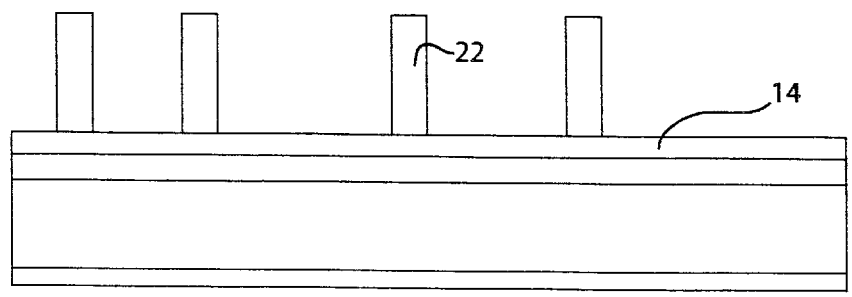
FIG. 3 a cross-sectional view through the semiconductor device of FIG. 2 at a subsequent stage of processing.

The process according to the present embodiment proceeds with etching of the SiARC and amorphous carbon layers 18 and 22 through the photo mask 20, so as selectively to remove those layers and expose underlying regions of the TiN hard mask 14, as shown in FIG. 2. Residual portions of the SiARC layer 18 are next removed by burnoff, as shown in FIG. 3, to leave "mandrels" of the amorphous carbon layer projecting from TiN layer 14.

Figure 4:
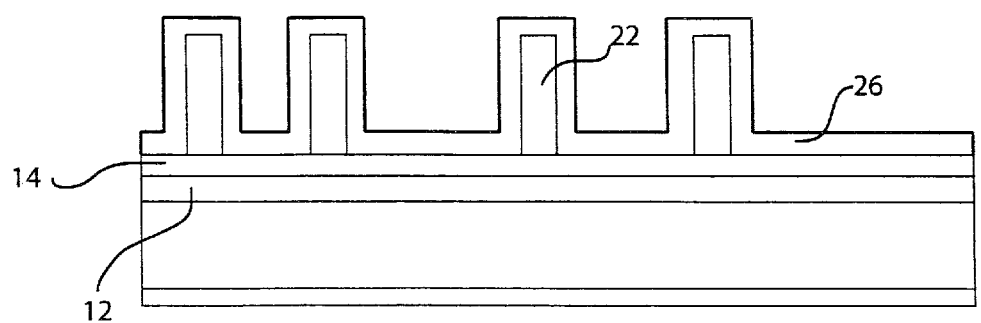
FIG. 4 a cross-sectional view through the semiconductor device of FIG. 3 at a subsequent stage of processing.
Figure 5:
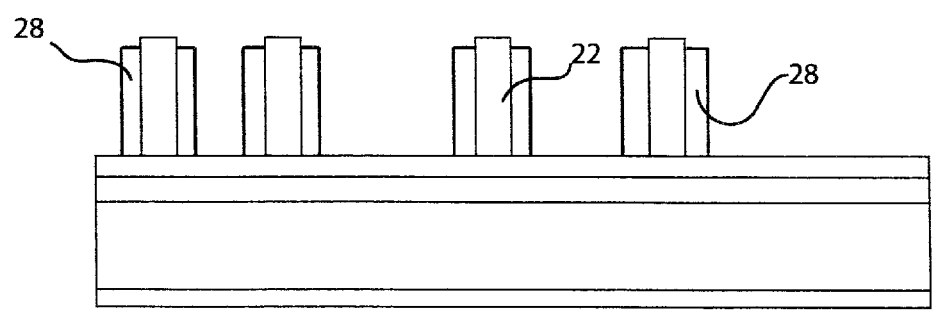
FIG. 5 a cross-sectional view through the semiconductor device of FIG. 4 at a subsequent stage of processing.
Figure 6:
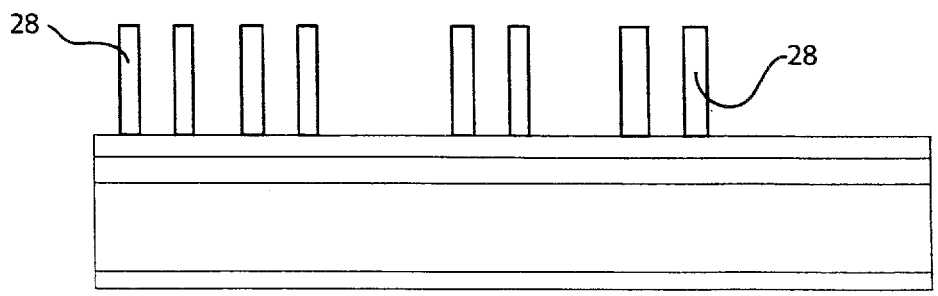
FIG. 6 a cross-sectional view through the semiconductor device of FIG. 5 at a subsequent stage of processing.

Referring now to FIG. 4, a spacer layer 26 of $SiO_2$ is deposited so as to cover the mandrels 22 and the TiN layer 14, followed by etching of the $SiO_2$ layer 26 to leave sidewalls 28 of $SiO_2$ on both sides of each mandrel 22, as shown in FIG. 5. The etching that forms sidewalls 28 can be performed for example using CF4 gas until the upper surface of the mandrels is exposed. Mandrel pull out is then performed, such that mandrels 22 are removed and sidewalls 28 remain, as shown in FIG. 6. Mandrel pull-out can be effected for example by asking with oxygen gas.

Figure 7:
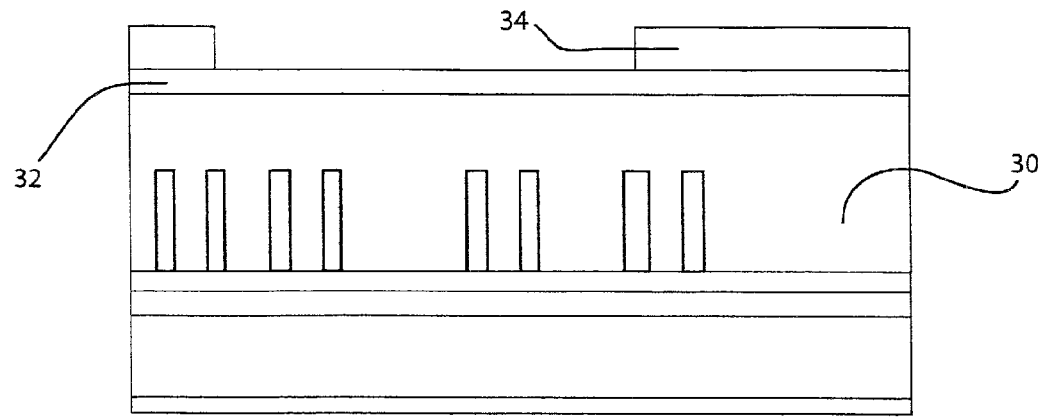
FIG. 7 a cross-sectional view through the semiconductor device of FIG. 6 at a subsequent stage of processing.

Referring now to FIG. 7, the sidewalls 28 are then covered with an organic planarization layer (OPL) 30. OPL 30 may include a photosensitive organic polymer or an etch type organic compound. Suitable photosensitive organic polymers include polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

Figure 8:
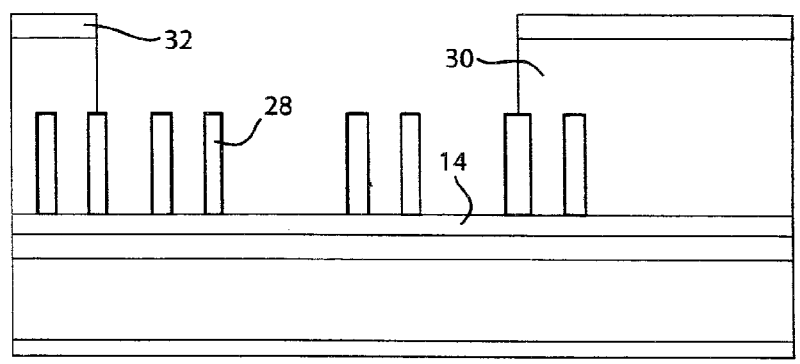
FIG. 8 a cross-sectional view through the semiconductor device of FIG. 7 at a subsequent stage of processing.
Figure 9:
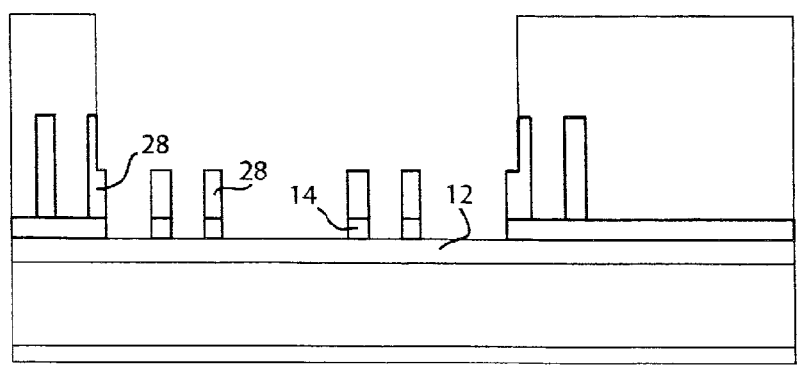
FIG. 9 a cross-sectional view through the semiconductor device of FIG. 8 at a subsequent stage of processing.

Above OPL 30 is an SiARC layer 32 followed by a photo mask 34 that will be used for block lithography to define the trench pattern, together with the sidewalls. Mask 34 in this embodiment is an argon fluoride (ArF) layer. In particular, FIG. 8 shows that SiARC layer 32 and OPL 30 are selectively removed through mask 34 in a first etching process, whereafter the remainder of SiARC layer 32 is removed and TiN layer 14 is selectively etched, as shown in FIG. 9. Specifically, the SiARC layer is preferably first etched through mask 34 using $CF_4$, and OPL 30 is preferably then etched using $O_2$ or $N_2/H_2$ gas. ArF layer 34 remains after these steps, and is then removed (FIG. 8).

The TiN layer 14 is preferably etched by $Cl_2$ using SiARC layer 32 and OPL 30 as a mask. The portions of TiN layer 14 etched are those exposed by sidewalls 28 and the opening in layers 30 and 32 that was defined by mask 34. It can be seen that the etching of TiN layer 14 also erodes the exposed sidewalls 28, causing a reduction in their height.

Figure 10:
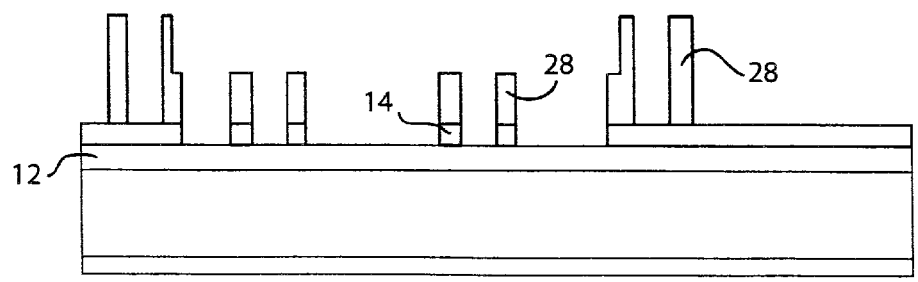
FIG. 10 a cross-sectional view through the semiconductor device of FIG. 9 at a subsequent stage of processing.
Figure 11:
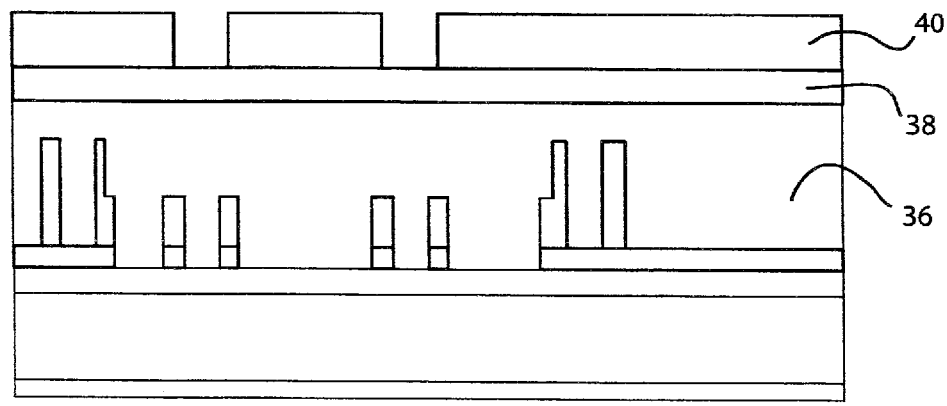
FIG. 11 a cross-sectional view through the semiconductor device of FIG. 10 at a subsequent stage of processing.
Figure 12:
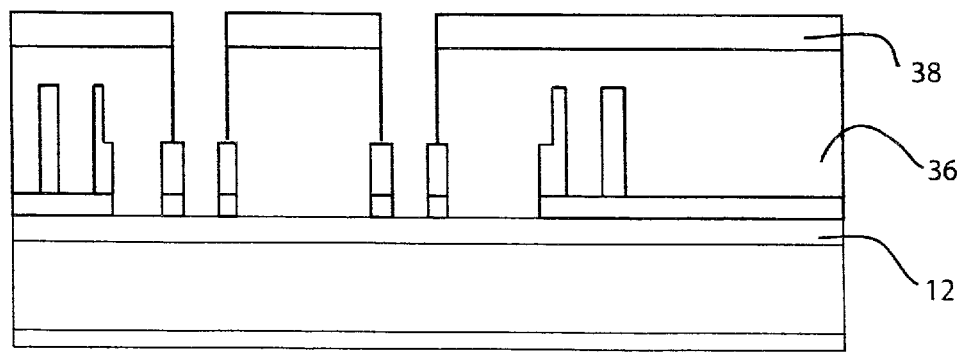
FIG. 12 a cross-sectional view through the semiconductor device of FIG. 11 at a subsequent stage of processing.

Referring now to FIG. 10, OPL 30 is next stripped away, a new OPL 36, SiARC layer 38 and photo mask 40 are formed (see FIG. 11), with the pattern of mask 40 defining the locations where the vias will be formed. Then as shown in FIG. 12 the SiARC layer 38 and OPL 36 are etched through mask 40, to expose underlying regions of TEOS film 12.

Figure 13A:
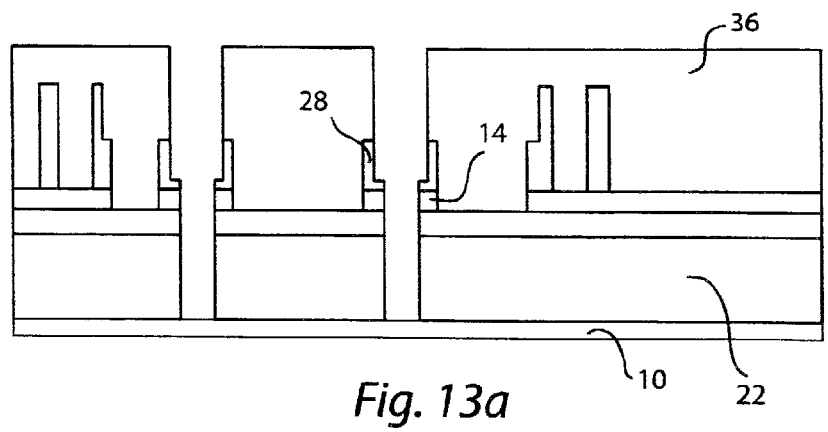
FIG. 13a a cross-sectional view through the semiconductor device of FIG. 12 at a subsequent stage of processing.

Next, as shown in FIG. 13a, the TEOS layer 12 and dielectric layer 24 are selectively removed in a further etching step, in the regions between sidewalls 28 that are exposed through the openings in layers 36 and 38 that were defined by the mask 40. It will be noted that the exposed sidewalls 28 are further eroded during etching of layers 12 and 24; however, the height of the sidewalls prevents the underlying portions of the TiN hard mask 14 from being eroded, so that the cross-section of the via remains well-defined. Sidewalls 28 thus serve as sacrificial masks during this etching sequence, and permit the TiN layer 14 to be formed more thinly for a given chemistry than could be done according to the prior art, without compromising the via profile.

Figure 13B:
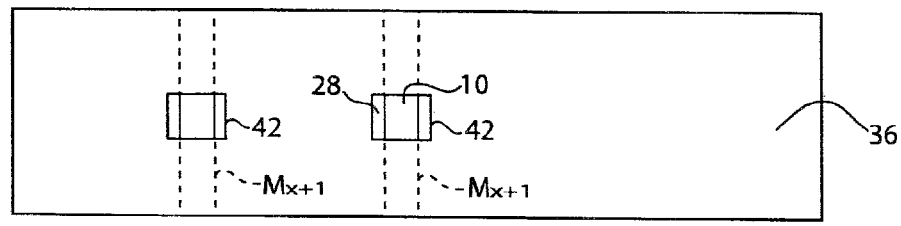

FIG. 13b shows the outline of the vias formed into the dielectric layer 24, with layer 10 being exposed at the bottom of the vias shown in FIG. 13a, and with portions of sidewalls 28 being visible where they protrude from OPL 36.

Figure 14:
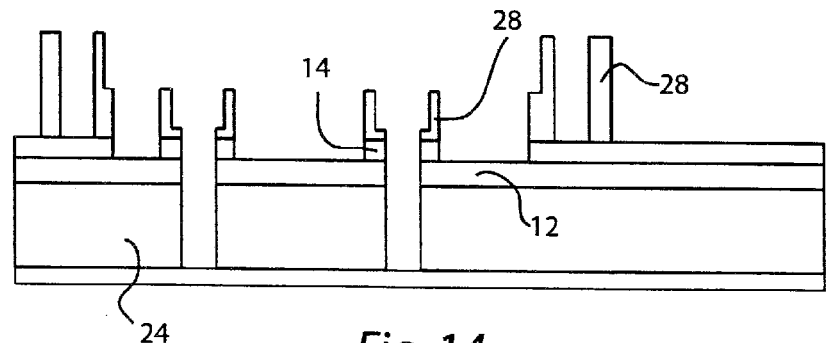
FIG. 14 a cross-sectional view through the semiconductor device of FIG. 13 at a subsequent stage of processing.

After stripping away OPL 36 (FIG. 14), the device undergoes etching to remove sidewalls 28, as well as to selectively etch the TEOS layer 12 and the dielectric layer 24 and the NBLoK layer 10 in the regions that are exposed by the sidewall spacers. Selective removal of layer 10 completes the formation of vias 42, whereas the selective removal and etching of layers 12 and 24 forms the trenches 44, as shown in FIG. 15.

The process just described would be considered a "trench first" technique, because the trench lithography is performed before the via-specific lithography, despite that the trenches themselves are formed after the vias.

Figure 15:
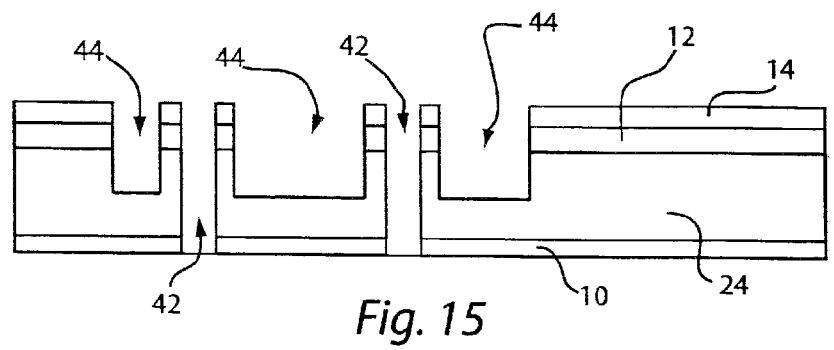
FIG. 15 a cross-sectional view through the semiconductor device of FIG. 14 at a subsequent stage of processing.

The structure shown in FIG. 15 is then filled with copper according to techniques known to those skilled in the art, to fill the vias 42 and trenches 44. When the trenches and vias are filled simultaneously by the same deposition of copper, this is termed "dual" damascene.

Figure 16:
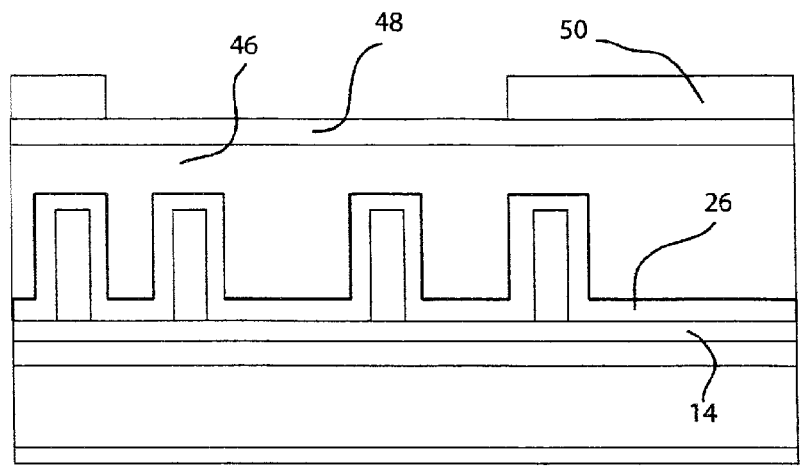
FIG. 16 a cross-sectional view through the semiconductor device of FIG. 1 at a stage of processing subsequent to that illustrated in FIG. 4, according to a second embodiment of the process according to the present invention.

Turning now to FIG. 16, an alternative embodiment of the process according to the invention is illustrated. FIG. 16 picks up where FIG. 4 leaves off, which is to say that the process according to the second embodiment is the same as that of the first embodiment through FIG. 4.

In this embodiment, however, the oxide layer 26 does not undergo etch back immediately after its formation; instead, OPL 46, SiARC layer 48 and mask 50 are formed over the continuous layer 26. This embodiment has the advantage that it more readily permits reworking the formation of the mask if it is determined that the mask is not properly registered in the first instance; that is, stripping of the mask 50, SiARC layer 48 and OPL 46 in the event that it is necessary to rework the lithography of this step will not damage the underlying TiN layer 14, as it is covered completely by the oxide layer 26.

Figure 17:
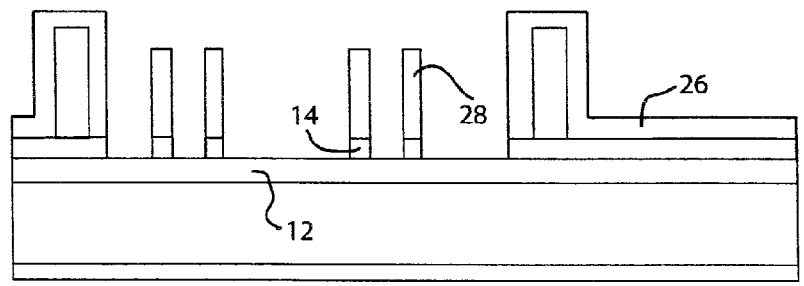
FIG. 17 a cross-sectional view through the semiconductor device of FIG. 16 at a subsequent stage of processing.

The structure depicted in FIG. 16 then undergoes processing as described above in connection with the first embodiment, so as to etch the layer 26 exposed through mask 50, followed by burnoff of the SiARC layer 48 in the previously masked regions (as described above in connection with FIG. 9), mandrel pull out for those amorphous carbon mandrels exposed by the etching of the sidewall spacers (as described above in connection with FIG. 6), etching of the TiN layer 14 in the region that had been exposed by mask 50, other than in the areas covered by sidewalls 28 (as described above in connection with FIG. 9), and removal of the remaining OPL 48 (as described above in connection with FIG. 10). The resulting structure is as depicted in FIG. 17.

Figure 18:
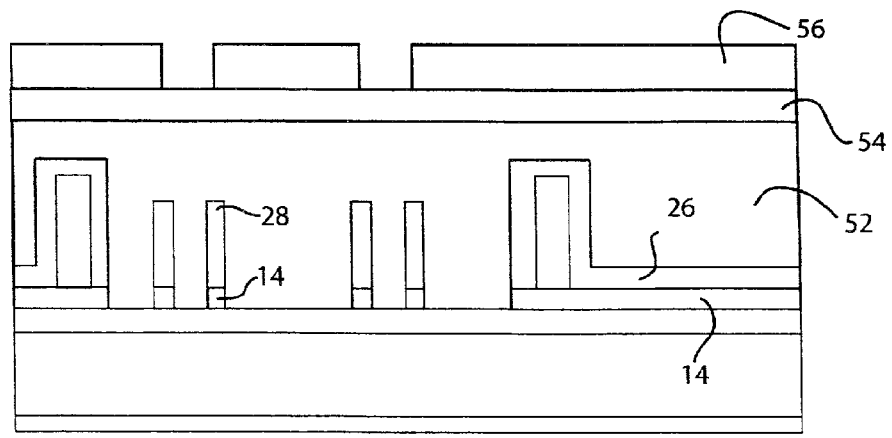
FIG. 18 a cross-sectional view through the semiconductor device of FIG. 17 at a subsequent stage of processing.

Via lithography is next performed as in the previous embodiment, such that the sidewalls 28 are covered with a new trilayer of OPL 52, SiARC layer 54 and via mask 56, as shown in FIG. 18. It will be noted that the remaining presence of spacer layer 26 in this embodiment serves to improve the protection of the underlying TiN mask layer 14 during subsequent etching steps.

Figure 19:
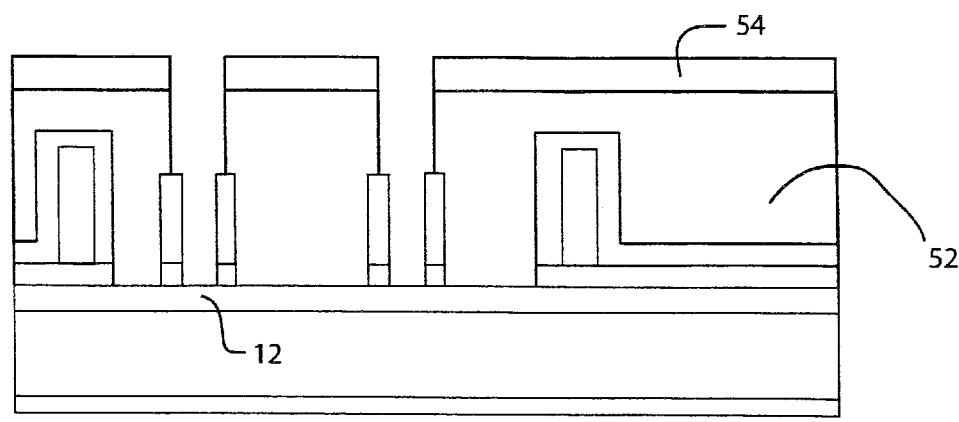
FIG. 19 a cross-sectional view through the semiconductor device of FIG. 18 at a subsequent stage of processing.
Figure 20:
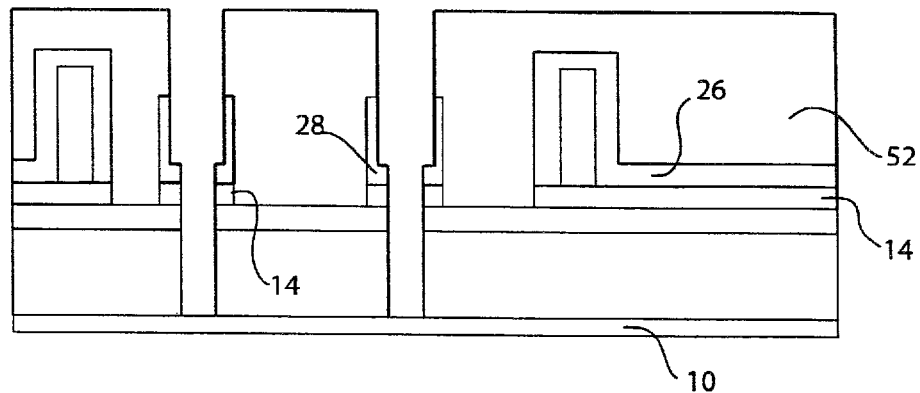
FIG. 20 a cross-sectional view through the semiconductor device of FIG. 19 at a subsequent stage of processing.

As shown in FIG. 19, etching of the SiARC layer 54 and OPL 52 is then performed through mask 56 so as to expose TEOS layer 12 at the via locations. Next, the via dielectric etch is performed, so as to remove the exposed regions of TEOS layer 12 as well as the underlying regions of dielectric layer 24, down to the NBLoK layer 10, as shown in FIG. 20. During this processing, the sidewalls 28 again act as a sacrificial mask that prevents erosion of the TiN layer 14 and preserves the correct via profile. The sidewalls 28 in this embodiment are present in regions corresponding to the dense line region of the finished device. Also, according to this embodiment, the full height of the spacer layer 26 serves to protect the underlying regions of TiN layer 14, which in this embodiment correspond to the field area of the device.

Figure 21:
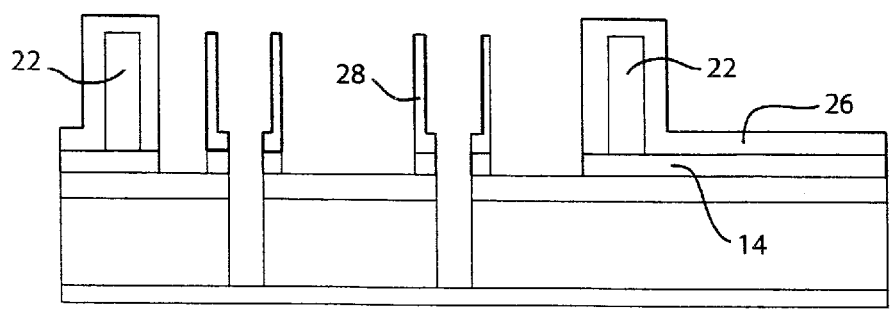
FIG. 21 a cross-sectional view through the semiconductor device of FIG. 20 at a subsequent stage of processing.

OPL 52 is then removed, to yield the structure depicted in FIG. 21. It will be seen in FIG. 21 that mandrels 22 of amorphous carbon still remain at this stage where they are covered by regions of the spacer layer 26 that have not been etched by the processing conducted up to this point. These mandrels may if desired be removed either by a prolonged OPL plasma strip or an extra downstream asking step, or, alternatively, they may simply be permitted to remain in the finished device.

Figure 22:
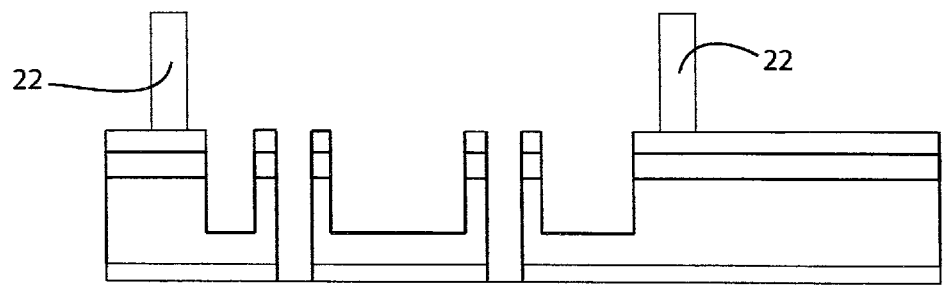
FIG. 22 a cross-sectional view through the semiconductor device of FIG. 21 at a subsequent stage of processing.
Figure 23:
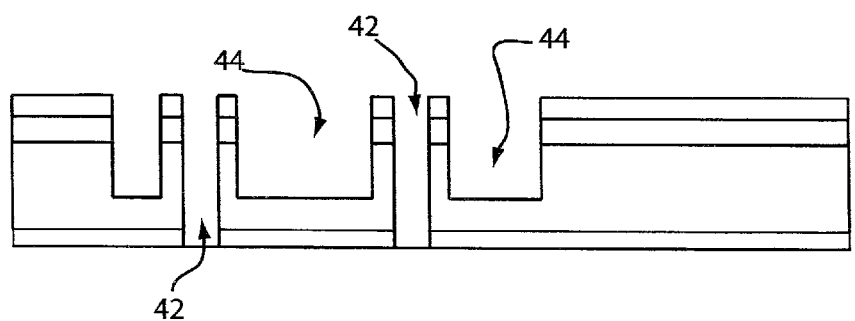
FIG. 23 a cross-sectional view through the semiconductor device of FIG. 22 at a subsequent stage of processing.

FIG. 22 shows the structure after performing the trench etch and opening of the NBLoK layer 10 as described for the first embodiment, with vias 42 and trenches 44 now being fully formed and ready to be filled with copper. FIG. 22 shows the remaining exposed mandrels 22, whereas FIG. 23 shows the device after the optional removal of the remaining mandrels 22 e.g. by stripping of the amorphous carbon material that constitutes the mandrels 22.

Figure 24A:
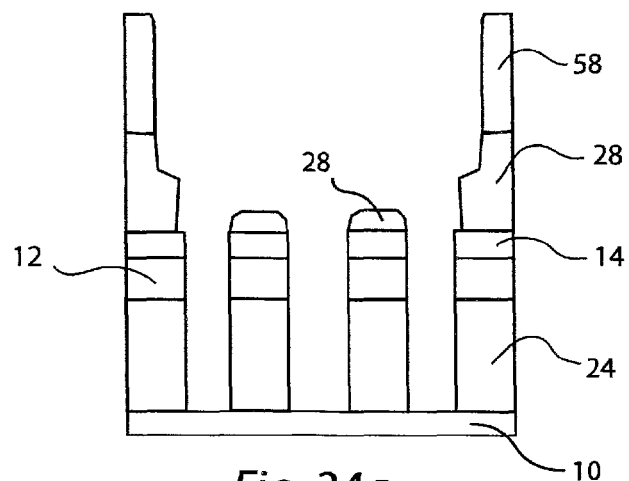
FIG. 24a a cross-sectional view through a semiconductor device during via etching according to a third embodiment of the present invention.
Figure 24B:
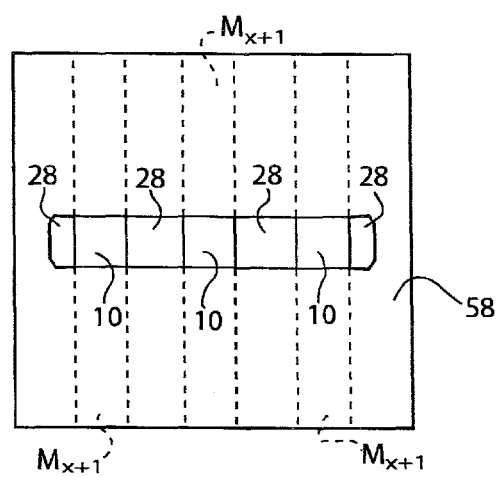

FIGS. 24a and 24b illustrate a third embodiment according to the invention, at a stage of processing corresponding to that illustrated in FIGS. 13a and 13b for the first embodiment, and in FIG. 20 for the second embodiment. In this embodiment the vias are relatively closely spaced; therefore, it is unnecessary to form separate openings for the vias in the trilayer mask. Instead, as shown in FIG. 24b, a single elongated opening in OPL 58 can together with the middle sidewall spacers 28 define a series of closely spaced vias formed in hard mask layer 14 and thence into dielectric layer 24. This technique is referred to as a "bar via." The variation of this embodiment may be utilized in either of the first and second embodiments described previously.

The techniques described above permit more accurate formation of vias while also permitting the metal hard mask to be formed at a smaller thickness than in the conventional techniques; alternatively, the metal hard mask can be formed at about the same thickness as in the conventional techniques, but according to the invention it is not necessary to use an SAV etch chemistry that is so highly selective against the material of the hard mask layer.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A method of forming a semiconductor device comprising:

forming a first mask having a first pattern defining a grooved area, said first mask overlying a metal film formed in an interconnect dielectric layer of said semiconductor device, wherein said first mask is formed by sidewall image transfer;

forming a second mask having at least one opening overlapping said first pattern to form a second pattern, said second mask overlying said first mask and said opening overlapping said grooved area in plan view;

etching the interconnect dielectric layer through said first and second masks, to transfer said first pattern to said interconnect dielectric layer; and etching the interconnect dielectric layer through said second mask, to transfer said second pattern to said interconnect dielectric layer;

wherein said first pattern is formed in said interconnect dielectric layer to a different depth than said second pattern.

2. The method according to claim 1, wherein said first pattern is transferred to the interconnect dielectric layer as a series of trenches extending part way into a thickness of the interconnect dielectric layer.

3. The method according to claim 1, wherein said second pattern is transferred to the interconnect dielectric layer as a via extending through an entire thickness of the interconnect dielectric layer.

4. The method according to claim 1, wherein said first mask is formed by forming a plurality of mandrels by lithography, applying a layer of insulating material to the mandrels, selectively removing the layer of insulating material to leave sidewalls of the insulating material on the mandrels, and removing the mandrels while retaining the sidewalls.

5. The method according to claim 1, wherein said first and second patterns in said interconnect dielectric layer are filled with copper.

6. The method according to claim 1, wherein said second mask comprises an overlying photoresist layer and an underlying organic planarization layer.

7. The method according to claim 1, further comprising forming a third mask overlying said first mask before forming said second mask, said third mask exposing a region in which said first pattern is to be formed and covering a region in which said first pattern is not to be formed.

8. The method according to claim 1, further comprising:
forming a third mask overlying an oxide layer from which said first mask will be formed before forming said first mask, said third mask exposing a region in which said first pattern is to be formed and covering a region in which said first pattern is not to be formed; and
forming said first mask by selective removal of said oxide layer through said third mask;
wherein said oxide layer is not removed in said region in which said first pattern is not to be formed.

9. The method according to claim 1, wherein said second mask comprises plural openings, each defining with said first mask a single via pattern.

10. The method according to claim 1, wherein said second mask comprises an elongated opening defining with said first mask a series of adjacent via patterns.

11. The method according to claim 4, wherein said sidewalls have at least one of a thickness and spacing that is below a resolution of radiation used to perform said lithography.

12. The method according to claim 4, wherein said mandrels are an organic material deposited by chemical vapor deposition or a spin-on technique.

13. The method according to claim 12, wherein said mandrels are formed from amorphous carbon.

* * * * *